(12) United States Patent
Sato

(10) Patent No.: US 9,231,043 B2
(45) Date of Patent: Jan. 5, 2016

(54) ORGANIC ELECTROLUMINESCENCE DISPLAY DEVICE

(71) Applicant: Japan Display Inc., Tokyo (JP)

(72) Inventor: Toshihiro Sato, Tokyo (JP)

(73) Assignee: JAPAN DISPLAY INC., Toyko (JE)

( * ) Notice: Subject to any disclaimer, the term of this patent is extended or adjusted under 35 U.S.C. 154(b) by 0 days.

(21) Appl. No.: 14/494,655

(22) Filed: Sep. 24, 2014

(65) Prior Publication Data

US 2015/0084023 A1 Mar. 26, 2015

(30) Foreign Application Priority Data

Sep. 25, 2013 (JP) ................. 2013-198018

(51) Int. Cl.
*H01L 35/24* (2006.01)
*H01L 51/00* (2006.01)
*H01L 27/32* (2006.01)
*H01L 51/52* (2006.01)

(52) U.S. Cl.
CPC .......... *H01L 27/3276* (2013.01); *H01L 27/322* (2013.01); *H01L 51/5253* (2013.01); *H01L 51/5275* (2013.01); *H01L 51/5284* (2013.01)

(58) Field of Classification Search
CPC . H01L 27/32; H01L 27/3202; H01L 27/3204; H01L 27/3209; H01L 27/3225; H01L 27/3251; H01L 27/3258; H01L 2227/32; H01L 2924/12044

USPC ................................. 257/40, 79, 89
See application file for complete search history.

(56) References Cited

U.S. PATENT DOCUMENTS

| 2012/0248475 | A1 | 10/2012 | Yamada et al. |
| 2014/0077171 | A1* | 3/2014 | Yamakita et al. ............... 257/40 |
| 2015/0087093 | A1* | 3/2015 | Sakano et al. .................. 438/27 |

FOREIGN PATENT DOCUMENTS

JP 2012-216338 A 11/2012

* cited by examiner

*Primary Examiner* — Hoai V Pham
(74) *Attorney, Agent, or Firm* — Lowe Hauptman & Ham, LLP

(57) ABSTRACT

An insulating layer is disposed in areas between pixel electrodes adjacent to each other so as to rest on peripheries of the pixel electrodes. An organic layer is disposed to include a common layer that continuously covers the pixel electrodes and the insulating layer. A common electrode is disposed on the organic layer. A sealing layer conducts sealing to cover the organic layer and the common electrode. The pixel electrodes have depressed portions whose upper surfaces are recessed on ends including the peripheries of the pixel electrodes. The common layer has depressed portions whose upper surfaces are recessed in correspondence with the depressed portions of the pixel electrodes. The common electrode has depressed portions whose upper surfaces are recessed in correspondence with the depressed portions of the common layer. The sealing layer is curved in correspondence with the depressed portions of the common electrode.

7 Claims, 10 Drawing Sheets

ORGANIC ELECTROLUMINESCENCE DISPLAY DEVICE

CROSS-REFERENCE TO RELATED APPLICATION

The present application claims priority from Japanese application JP2013-198018 filed on Sep. 25, 2013, the content of which is hereby incorporated by reference into this application.

BACKGROUND OF THE INVENTION

1. Field of the Invention

The present invention relates to an organic electroluminescent display device.

2. Description of the Related Art

An organic electroluminescent display device has a structure in which an organic film is sandwiched between an anode and a cathode (refer to JP 2012-216338 A). As usual, plural organic films are laminated on each other, and one of those organic films is a light emitting layer. In order to obtain light emission of one color (for example, white) in plural pixels, the organic film for making the light emitting layer is wholly continuously formed. Alternatively, in order to obtain the light emission of plural colors in the plural pixels, the organic film for making the light emitting layer is separated for each of pixels, but the organic film for making a hole injection layer, an electron injection layer, a hole transport layer, or an electron transport layer is continuously formed. Even in any case, at least one organic film is continuously formed over the pixels adjacent to each other.

In a high-quality display device, the pixels adjacent to each other come closer to each other by miniaturization of the pixels. For that reason, a light generated in any pixel may penetrate to the adjacent pixels. If colors of the pixels adjacent to each other are different from each other, there arises such a problem that the colors are mixed together. JP 2012-216338 A discloses such a problem that pixels from which no light is to be emitted emits a light by leakage of a current to the adjacent pixels, but fails to disclose such a problem that the light per se penetrates to the adjacent pixels.

SUMMARY OF THE INVENTION

The present invention relates to the prevention of color mixture in pixels adjacent to each other.

(1) According to the present invention, there is provided an organic electroluminescent display device, including: a substrate; a plurality of pixel electrodes that are disposed on the substrate; an insulating layer that is disposed in areas between the respective pixel electrodes adjacent to each other so as to rest on at least peripheries of the respective pixel electrodes; an organic layer that is disposed with the inclusion of a common layer that continuously covers the plurality of pixel electrodes and the insulating layer; a common electrode that is disposed on the organic layer; and a sealing layer that is disposed to cover the organic layer and the common electrode, in which each of the respective pixel electrodes has a depressed portion whose upper surface is recessed on an end of the periphery thereof. According to the present invention, since the light generated in the organic layer is diffusely reflected, diffuses, or is bent in the depressed portions of the pixel electrodes, the light is hardly recognized as the light of the adjacent pixels. As a result, the color mixture of the pixels adjacent to each other can be prevented.

(2) In the organic electroluminescent display device according to the item (1), the insulating layer may have depressed portions whose upper surfaces are recessed by resting on the depressed portions of the respective pixel electrodes, and the common layer may have depressed portions whose upper surfaces are recessed in correspondence with the depressed portions of the insulating layer.

(3) In the organic electroluminescent display device according to the item (1), the common layer may have depressed portions whose upper surfaces are recessed in correspondence with the depressed portions of the pixel electrodes, and the insulating layer may rest on the peripheries of the respective pixel electrodes so as to avoid at least a part of the depressed portions of the respective pixel electrodes, and the depressed portions of the common layer may come in contact with the at least a part of the depressed portions of the pixel electrodes.

(4) The organic electroluminescent display device according to the item (1) or (2) may further include: a wiring layer that is disposed below the respective pixel electrodes, in which at least apart of the depressed portions of the respective pixel electrodes may be electrically connected to the wiring layer.

(5) The organic electroluminescent display device according to the item (3) may further include: a wiring layer that is disposed below the respective pixel electrodes, in which at least a part of the depressed portions of the respective pixel electrodes may be electrically connected to the wiring layer.

(6) In the organic electroluminescent display device according to the item (5), the depressed portions of the respective pixel electrodes may include a portion that is electrically connected to the wiring layer, and a portion that is not electrically connected to the wiring layer, and the depressed portions of the common layer may come in contact with the portion of the depressed portions of the pixel electrodes, which is not electrically connected to the wiring layer.

(7) In the organic electroluminescent display device according to any one of the items (1) to (3), the plurality of pixel electrodes may be arrayed in a second direction and a first direction, and the depressed portions of the respective pixel electrodes may be continuously formed over from an area extending in the first direction at a position displaced in one of the second direction to an area extending in the second direction at a position displaced in one of the first direction.

(8) In the organic electroluminescent display device according to the item (4), the plurality of pixel electrodes may be arrayed in a second direction and a first direction, and the depressed portions of the respective pixel electrodes may be continuously formed over from a first area extending in the first direction at a position displaced in one of the second direction to a second area extending in the second direction at a position displaced in one of the first direction.

(9) In the organic electroluminescent display device according to the item (8), the depressed portions of the respective pixel electrodes may be continuously and electrically connected to the wiring layer over from the first area to the second area.

(10) In the organic electroluminescent display device according to the item (8), the depressed portions of the respective pixel electrodes may be electrically connected to the wiring layer in only a connection area of the first area and the second area.

(11) In the organic electroluminescent display device according to any one of the items (1) to (4), the plurality of pixel electrodes may include a first group of the pixel electrodes which are arrayed in a second direction and a first direction, and formed with the respective depressed portions in the ends on both sides of the first direction, and a second group of the pixel electrodes which are formed with the respective depressed portions in the ends on both sides of the second direction, and the first group of the pixel electrodes and the second group of the pixel electrodes may be alternately arrayed in the second direction and the first direction.

(12) In the organic electroluminescent display device according to any one of the items (1) to (4), the plurality of pixel electrodes may be arrayed in a second direction and a first direction, the respective pixel electrodes may have a planar shape elongated in the first direction, and the depressed portions of the respective pixel electrodes may extend in the first direction at a position displaced in one of the second direction.

(13) In the organic electroluminescent display device according to the item (12), the depressed portions of the respective pixel electrodes may include a plurality of divided depressed portions arrayed at an interval between the adjacent divided depressed portions.

(14) In the organic electroluminescent display device according to any one of the items (2), (3), (5), and (6), the common electrode may have depressed portions whose upper surfaces are recessed in correspondence with the depressed portions of the common layer.

(15) In the organic electroluminescent display device according to the item (14), the sealing layer may be curved in correspondence with the depressed portions of the common electrode.

DETAILED DESCRIPTION OF THE INVENTION

Hereinafter, embodiments of the present invention will be described with reference to the accompanying drawings.

Figure 1:
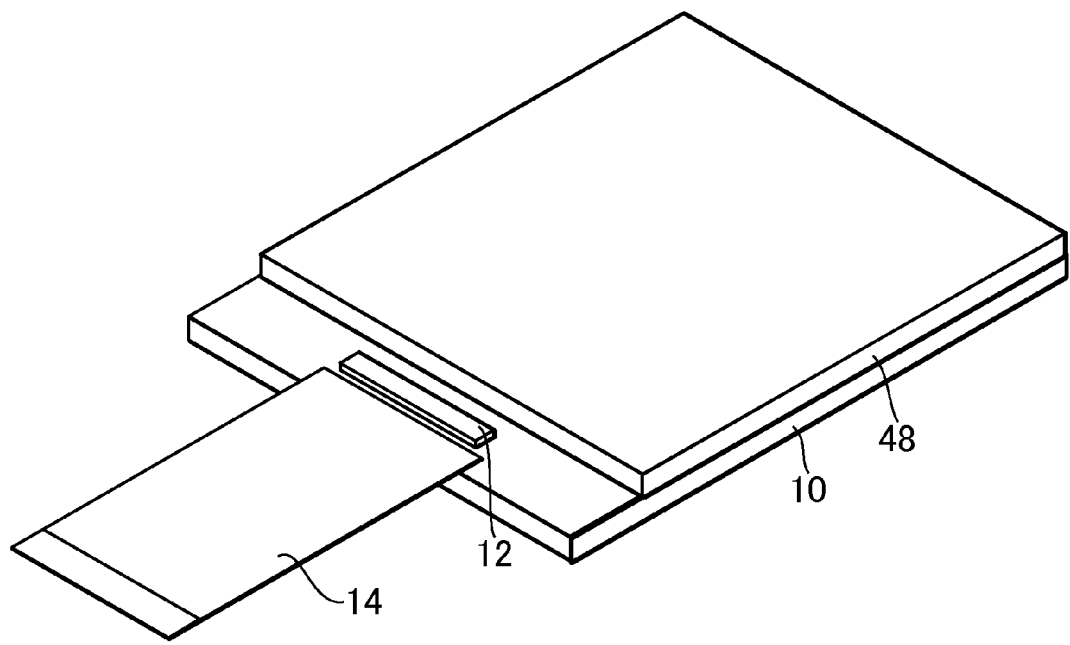
FIG. 1 is a perspective view of an organic electroluminescent display device according to an embodiment of the present invention.

FIG. 1 is a perspective view of an organic electroluminescent display device according to an embodiment of the present invention. The organic electroluminescent display device includes a first substrate 10 with an optical transparency made of glass. The first substrate 10 has an image display area for image display. An integrated circuit chip 12 for driving elements for displaying an image is mounted on the first substrate 10. The first substrate 10 is connected with a flexible wiring substrate 14 for electric connection with an external.

Figure 2:
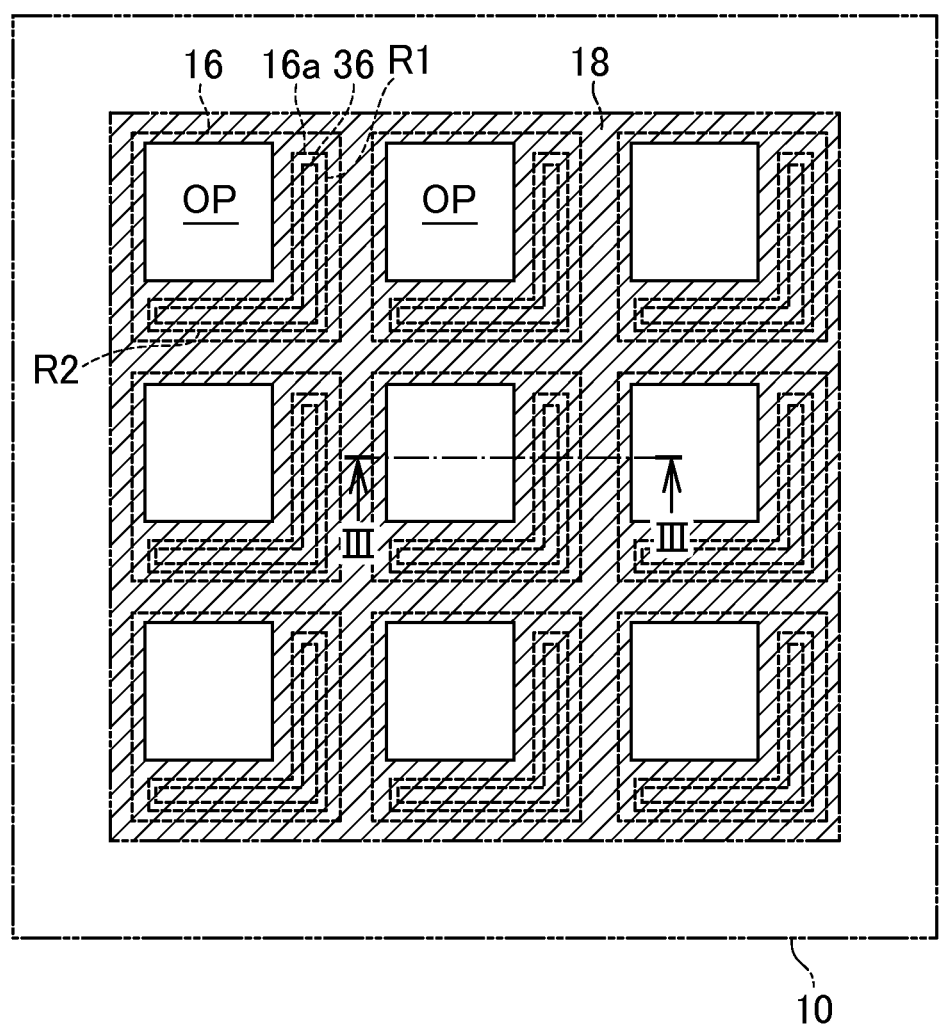
FIG. 2 is a partially enlarged plan view of the organic electroluminescent display device illustrated in FIG. 1.

FIG. 2 is a partially enlarged plan view of the organic electroluminescent display device illustrated in FIG. 1. Plural pixel electrodes 16 are disposed on the first substrate 10. The plural pixel electrodes 16 are arrayed in a first direction and a second direction which intersected the first direction. In this embodiment, the first direction is vertical direction, the second direction is horizontal direction. An insulating layer 18 is so disposed as to rest on at least peripheries of the pixel electrodes 16. The insulating layer 18 is disposed in areas between the pixel electrodes 16 adjacent to each other. The insulating layer 18 is configured to surround the peripheries of the respective pixel electrodes 16. The insulating layer 18 has openings OP from which parts (portions other than the ends) of the pixel electrodes 16 are exposed.

Figure 3:
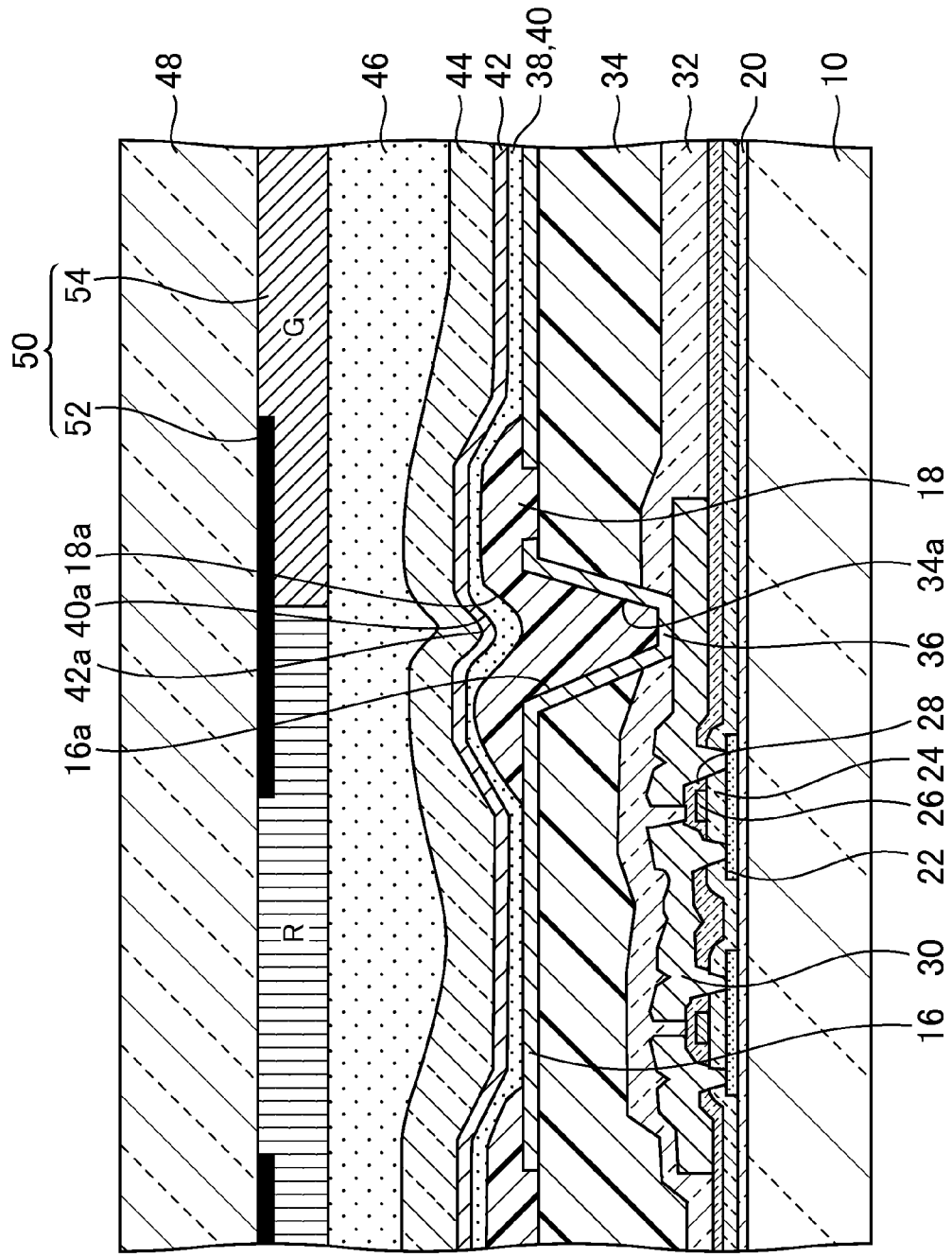
FIG. 3 is a cross-sectional view of the organic electroluminescent display device taken along a line III-III illustrated in FIG. 2.

FIG. 3 is a cross-sectional view of the organic electroluminescent display device taken along a line illustrated in FIG. 2.

The first substrate 10 is formed with an undercoat 20 that functions as a barrier against impurities from the first substrate 10, and a semiconductor layer 22 is formed on the undercoat 20. A gate insulating film 24 is formed to cover the semiconductor layer 22. A gate electrode 26 is formed on the gate insulating film 24, and an interlayer insulating film 28 is formed to cover the gate electrode 26. Plural wiring layers 30 are disposed on the first substrate 10 (on the interlayer insulating film 28). Apart of the wiring layers 30 penetrates through the interlayer insulating film 28, and functions as a source electrode or a drain electrode on the semiconductor layer 22, and forms a thin film transistor. A passivation film 32 is formed on the interlayer insulating film 28 so as to cover the wiring layers 30. Since an upper surface of the passivation film 32 becomes irregular, an underlying layer 34 is formed for the purpose of planarizing the passivation film 32. The underlying layer 34 is made of resin such as acrylic resin.

The pixel electrodes 16 are disposed on the underlying layer 34. The pixel electrodes 16 represent anodes. The pixel electrodes 16 each have a depressed portion 16a whose upper surface is recessed on an end including a periphery of the pixel electrode. The depressed portion 16a protrudes downward from a lower surface of the pixel electrode 16. The depressed portion 16a penetrates through the underlying layer 34. The underlying layer 34 has a hole 34a (throughhole) in correspondence with the depressed portion 16a. As illustrated in FIG. 2, the depressed portion 16a of each of the pixel electrodes 16 is continuously formed over from a first area R1 that extends in the first direction at a position displaced in one of the second direction to a second area R2 that extends in the second direction at a position displaced in one of the first direction. That is, the depressed portion 16a of each of the pixel electrodes 16 is formed into an L-shaped planar shape.

The wiring layers 30 are disposed below the plural pixel electrodes 16. At least a part of the depressed portion 16a of the pixel electrode 16 is electrically connected to the wiring layers 30. In detail, each pixel electrode 16 disposed on the underlying layer 34 is joined to the wiring layer 30 by the depressed portion 16a through the hole 34a that penetrates through the underlying layer 34. The depressed portion 16a of the pixel electrode 16 is continuously electrically connected to the wiring layer 30 over from the first area R1 to the second area R2. That is, a contact portion 36 between the depressed portion 16a of the pixel electrode 16 and the wiring layer 30 is formed into an L-shaped planar shape as illustrated in FIG. 2.

The insulating layer 18 rests on the end of the pixel electrode 16. The insulating layer 18 rests on the depressed portion 16a of the pixel electrode 16 to form a depressed portion 18a whose upper surface is recessed. Also, the depressed portion 18a of the insulating layer 18 is continuously formed over from the first area R1 that extends in the first direction at a position that is displaced in one of the second direction to the second area R2 that extends in the second direction at a position that is displaced in one of the first direction, in correspondence with the depressed portion 16a (refer to FIG. 2) of the pixel electrode 16. That is, the depressed portion 18a of the insulating layer 18 is also formed into an L-shaped planar shape.

An organic electroluminescent film or an organic film 38 is disposed over the first substrate 10. The organic film 38 is configured to rest on the plural pixel electrodes 16 and the insulating layer 18. The organic film 38 includes plural layers although not shown, includes at least a light emitting layer, and further includes at least one layer of an electron transport layer, a hole transport layer, an electron injection layer, and a hole injection layer. The light emitting layer is configured to emit only a light of one color (for example, white).

The organic film 38 includes a common layer 40 that continuously covers the plural pixel electrodes 16 and the insulating layer 18. In an example illustrated in FIG. 3, the overall organic film 38 forms the common layer 40. Alternatively, at least one layer (except for at least one layer) of the organic film 38 formed of the plural layers may be formed by the common layer 40 (for example, the electron injection layer), and the remaining layers formed of at least one layer may be cut for each of the pixel electrodes 16. In the organic film 38 with a tandem structure including two or more light emitting layers, a charge generation layer for supplying electrons or holes which is arranged between the light emitting layers adjacent to each other may be formed by the common layer 40.

The common layer 40 has depressed portions 40a whose upper surfaces are recessed in correspondence with the depressed portions 16a of the pixel electrodes 16. The depressed portions 40a of the common layer 40 correspond to the depressed portions 18a of the insulating layer 18. Each depressed portion 40a of the common layer 40 is also continuously formed over from the first area R1 that extends in the first direction at a position that is displaced in one of the second direction to the second area R2 that extends in the second direction at a position that is displaced in one of the first direction, in correspondence with the depressed portion 16a (refer to FIG. 2) of the pixel electrode 16. That is, the depressed portion 40a of the common layer 40 is also formed into the L-shaped planar shape.

A common electrode 42 is disposed on the organic film 38. The common electrode 42 is a cathode. The common electrode 42 has a depressed portion 42a whose upper surface is recessed in correspondence with the depressed portion 40a of the common layer 40. The depressed portion 42a of the common electrode 42 is also continuously formed over from the first area R1 that extends in the first direction at a position that is displaced in one of the second direction to the second area R2 that extends in the second direction at a position that is displaced in one of the first direction, in correspondence with the depressed portion 16a (refer to FIG. 2) of the pixel electrode 16. That is, the depressed portion 42a of the common electrode 42 is also formed into the L-shaped planar shape.

A voltage is applied to the pixel electrodes 16 and the common electrode 42 to inject holes and electrons into the organic film 38 from the respective electrodes 16 and 42. The injected holes and electrons are coupled together in the light emitting layer to emit a light. Since the insulating layer 18 is interposed between the end of the pixel electrode 16 and the common electrode 42, short-circuiting between the pixel electrode 16 and the common electrode 42 is prevented.

A sealing layer 44 is disposed on the common electrode 42. The sealing layer 44 also covers the organic film 38. The sealing layer 44 seals the organic film 38 so as to block moisture. The sealing layer 44 is curved in correspondence with the depressed portion 42a of the common electrode 42. In detail, a lower surface (interface with the common electrode 42) of the sealing layer 44 is curved on the depressed portion 42a of the common electrode 42. Also, an upper surface (interface with an upper layer) of the sealing layer 44 is curved above the depressed portion 42a of the common electrode 42.

Also, a curved portion of the sealing layer 44 is also continuously formed over from the first area R1 that extends in the first direction at a position that is displaced in one of the second direction to the second area R2 that extends in the second direction at a position that is displaced in one of the first direction, in correspondence with the depressed portion 16a (refer to FIG. 2) of the pixel electrode 16. That is, the curved portion of the sealing layer 44 is also formed into the L-shaped planar shape.

A filler layer 46 is disposed on the sealing layer 44. According to this embodiment, since a light input from the common layer 40 of the organic film 38 into the sealing layer 44 is diffusely reflected on the curved surface (interface with another layer) of the sealing layer 44, the light is hardly recognized as the light of the adjacent pixels. With the above configuration, the color mixture of the pixels adjacent to each other can be prevented.

A second substrate 48 is arranged to face the first substrate 10 at an interval. A color filter 50 is disposed on a surface of the second substrate 48 on the first substrate 10 side. The color filter 50 includes a black matrix 52 and a colored layer 54. Since a light emitting layer (not shown) of the above organic film 38 emits the light of a single color (for example, white), the color filter 50 is provided to enable full color display in this embodiment. When the organic film 38 includes plural light emitting layers that emit the light of different colors (for example, red, green, blue), since the light emitting layers emit the light of the plural colors, the colored layer 54 is not required. The filler layer 46 is disposed between the first substrate 10 and the second substrate 48.

Figure 4:
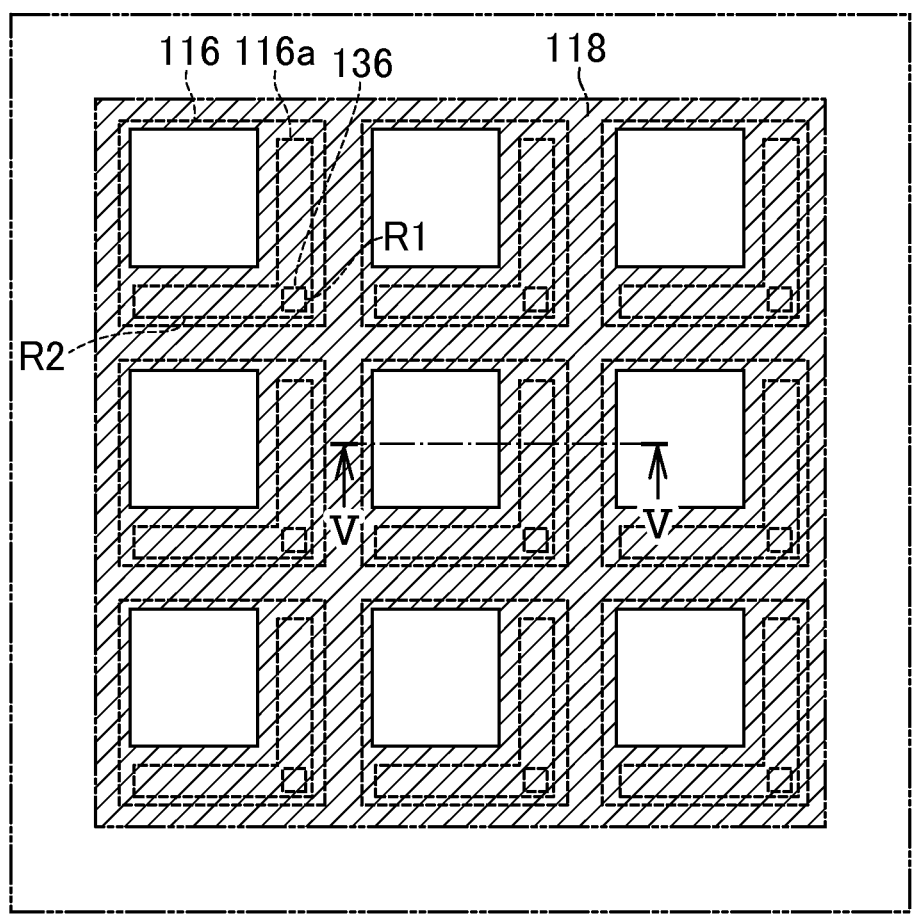
FIG. 4 is a partially enlarged plan view of an organic electroluminescent display device according to a modification 1 of the embodiment.
Figure 5:
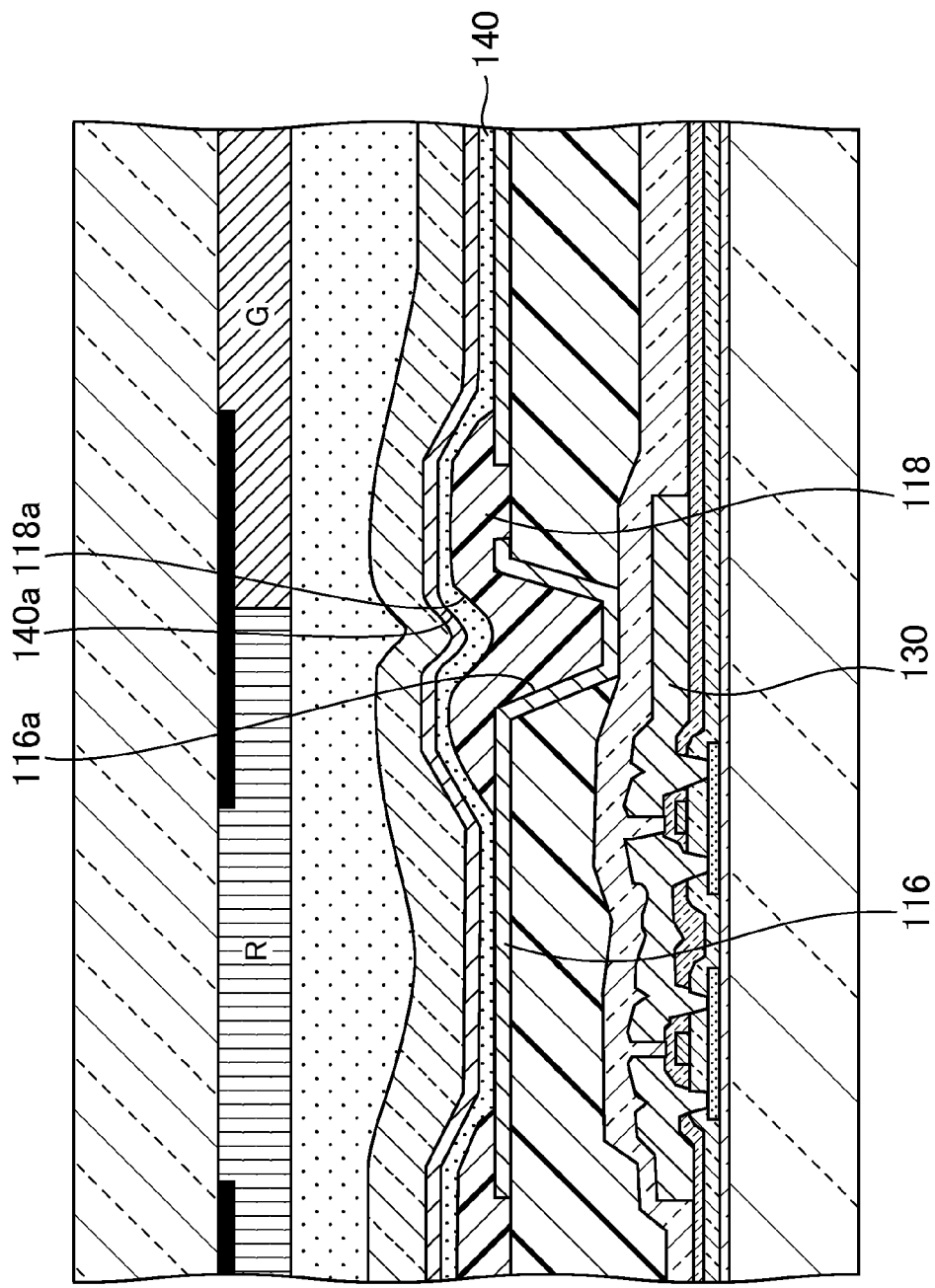
FIG. 5 is a cross-sectional view of the organic electroluminescent display device taken along a line V-V illustrated in FIG. 4.

FIG. 4 is a partially enlarged plan view of an organic electroluminescent display device according to a modification 1 of the embodiment. FIG. 5 is a cross-sectional view of the organic electroluminescent display device taken along a line V-V illustrated in FIG. 4.

Even in this example, an insulating layer 118 rests on a depressed portion 116a of each pixel electrode 116 to provide a depressed portion 118a whose upper surface is recessed. A depressed portion 140a of a common layer 140 corresponds to the depressed portion 118a of the insulating layer 118. The plural pixel electrodes 116 are arrayed in the second direction and the first direction. The depressed portion 116a of the pixel electrode 116 is continuously formed over from the first area R1 that extends in the first direction at a position that is displaced in one of the second direction to the second area R2 that extends in the second direction at a position that is displaced in one of the first direction. In a state where the deep depressed portion 118a is formed in the insulating layer 118, the common layer, the common electrode, and the sealing layer deeply enter the depressed portion 118a. With this structure, a contact area of the sealing layer with the first substrate increases, an adhesion of the sealing layer is improved, and the peeling of the sealing layer is prevented.

A difference from the example illustrated in FIG. 2 resides in that the depressed portion 116a of the pixel electrode 116 is electrically connected to a wiring layer 130 in only the connection area between the first area R1 and the second area R2. That is, as illustrated in FIG. 4, a contact portion 136 between the depressed portion 116a of the pixel electrode 116, and the wiring layer 130 is located on a corner of an L shape drawn by the first area R1 and the second area R2. The other details correspond to the details described in the above embodiment.

Figure 6:
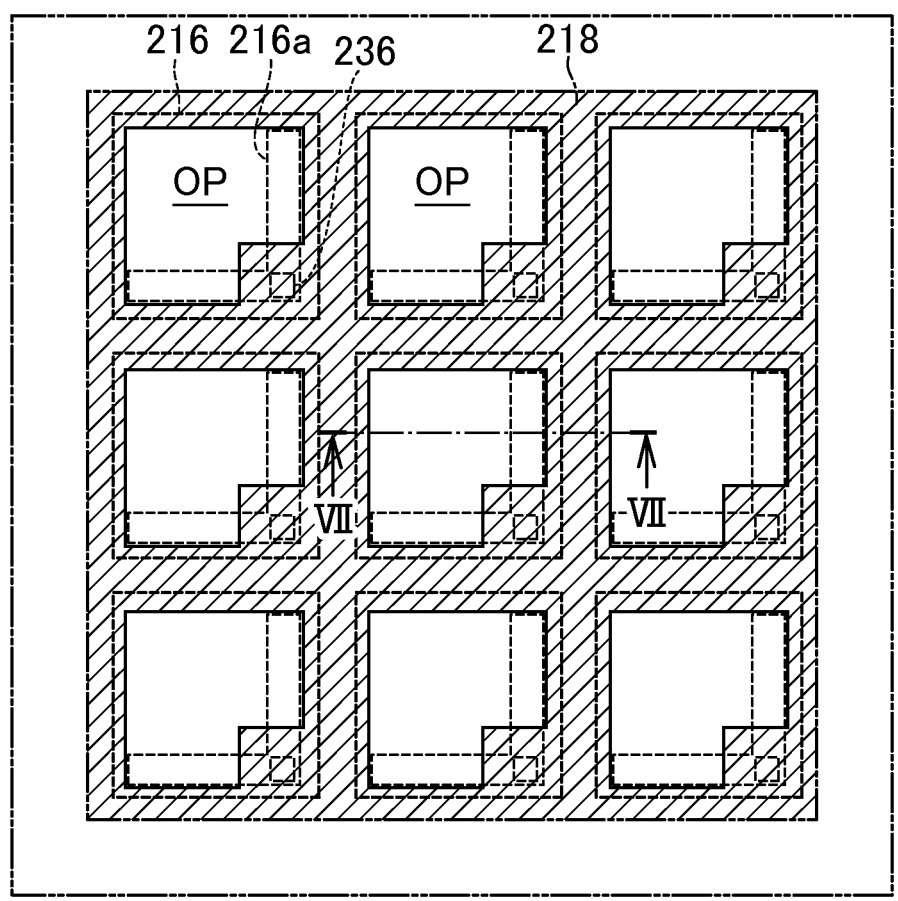
FIG. 6 is a partially enlarged plan view of an organic electroluminescent display device according to a modification 2 of the embodiment.
Figure 7:
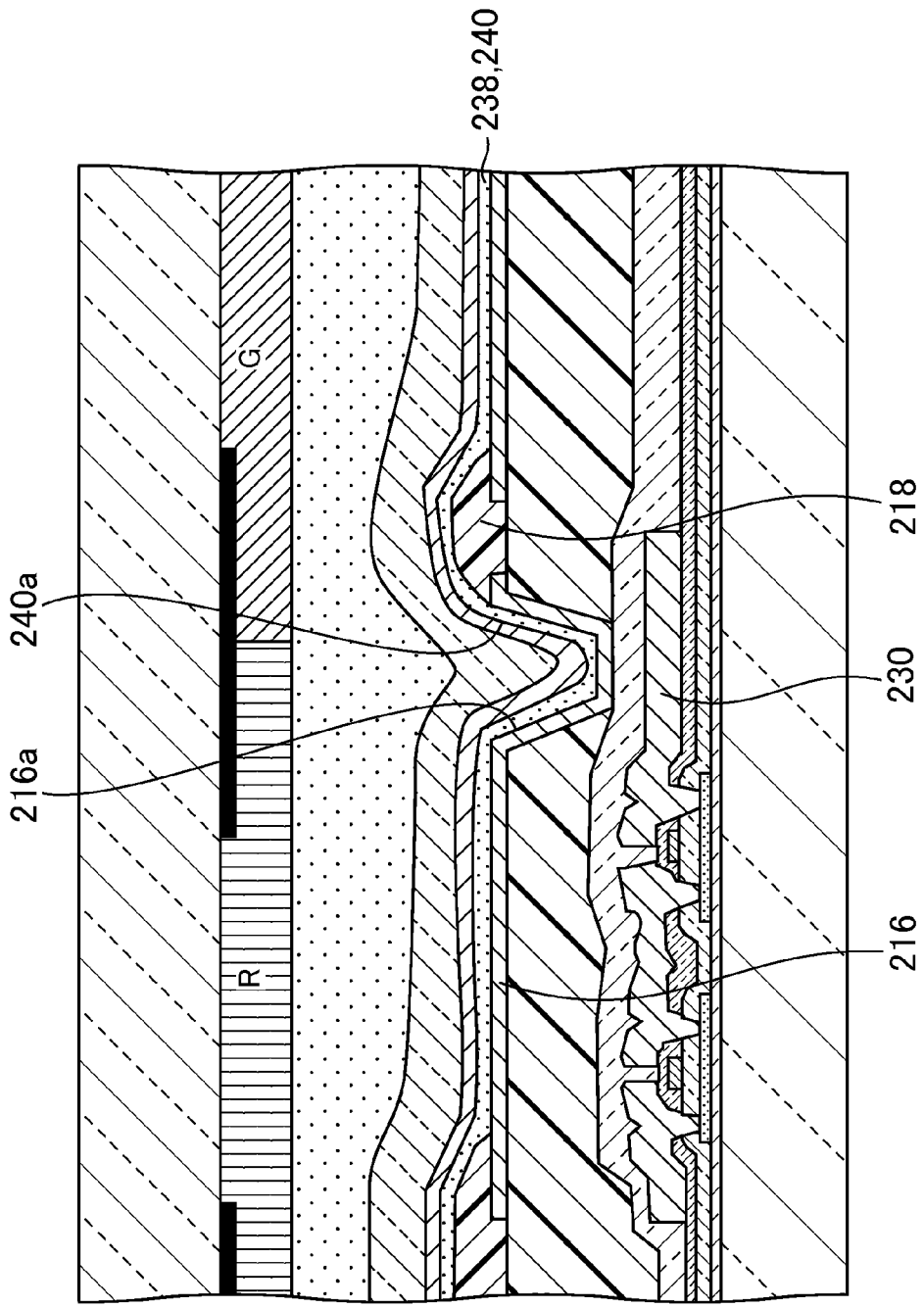
FIG. 7 is a cross-sectional view of the organic electroluminescent display device taken along a line VII-VII illustrated in FIG. 6.

FIG. 6 is a partially enlarged plan view of an organic electroluminescent display device according to a modification 2 of the embodiment. FIG. 7 is a cross-sectional view of the organic electroluminescent display device taken along a line VII-VII illustrated in FIG. 6.

In this example, as illustrated in FIG. 6, an insulating layer 218 rests on a periphery of each pixel electrode 216 so as to avoid at least a part of a depressed portion 216a of the pixel electrode 216. In other words, each of the openings OP in the insulating layer 218 exposes a part of the depressed portion 216a of the pixel electrode 216. In the example of FIG. 6, both of ends of the L-shaped depressed portion 216a except for one corner thereof are exposed from the opening OP.

As illustrated in FIG. 7, a depressed portion 240a of a common layer 240 of an organic layer 238 comes in contact with at least a part of the depressed portion 216a of the pixel electrode 216. If the common layer 240 is formed of a light emitting layer, a light generated by the depressed portion 240a thereof also becomes an element configuring an image.

The depressed portion 216a of the pixel electrode 216 has a portion (a contact portion 236 illustrated in FIG. 6) that is electrically connected to a wiring layer 230, and a portion (refer to FIG. 7) that is not electrically connected to the wiring layer 230. This configuration corresponds to that described in the modification 1.

As illustrated in FIG. 6, the contact portion 236 of the depressed portion 216a of the pixel electrode 216 with the wiring layer 230 is covered with the insulating layer 218. Therefore, as illustrated in FIG. 7, the depressed portion 240a of the common layer 240 of the organic layer 238 comes in contact with the portion in which the depressed portion 216a of the pixel electrode 216 is not electrically connected to the wiring layer 230.

Figure 8:
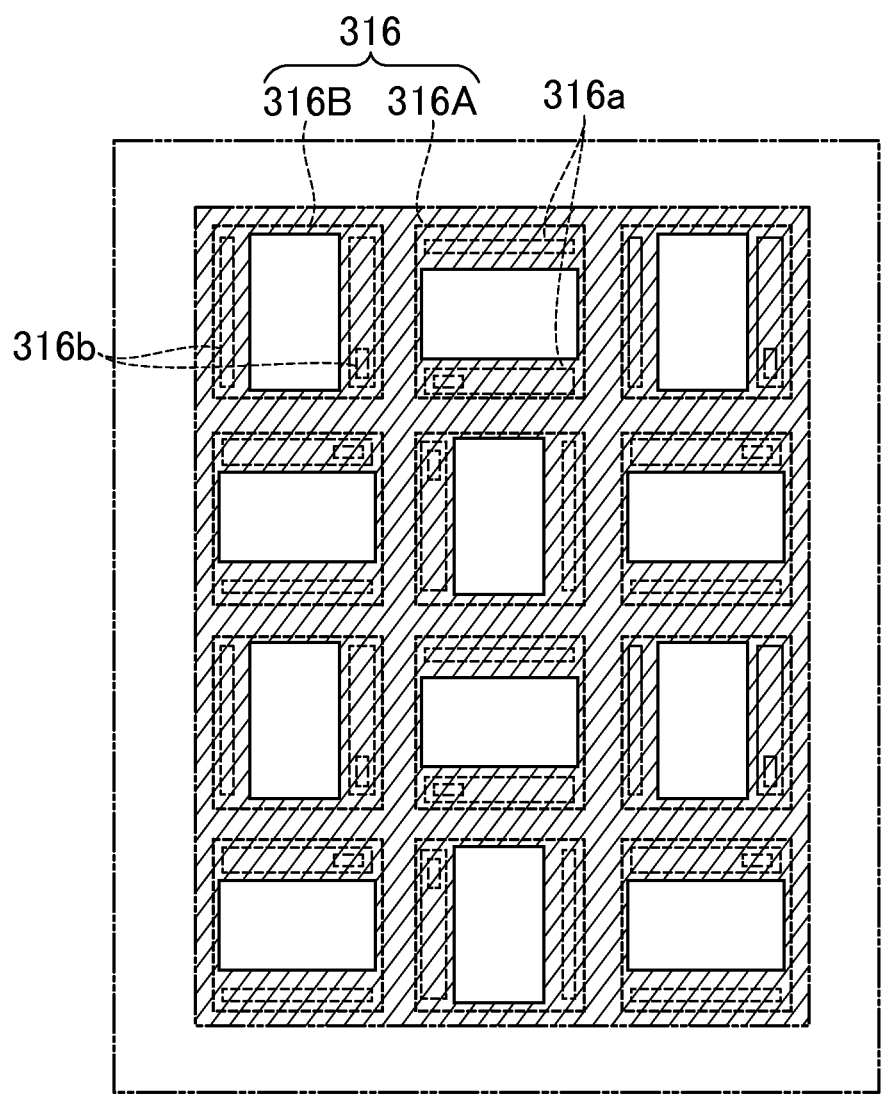
FIG. 8 is a partially enlarged plan view of an organic electroluminescent display device according to a modification 3 of the embodiment.

FIG. 8 is a partially enlarged plan view of an organic electroluminescent display device according to a modification 3 of the embodiment.

Even in this example, plural pixel electrodes 316 are arrayed in the second direction and the first direction. The plural pixel electrodes 316 include a first group of pixel electrodes 316A in which respective depressed portions 316a are formed on ends at both of sides thereof in the first direction, and a second group of pixel electrodes 316B in which respective depressed portions 316b are formed on ends at both of sides thereof in the second direction. The first group of the pixel electrodes 316A and the second group of the pixel electrodes 316B are alternately arrayed in the second direction and the first direction.

Since each of the first group of the pixel electrodes 316A is formed with the depressed portions 316a on both of the sides thereof in the first direction, the sealing layer is curved above the depressed portions 316a, to thereby diffusely reflect the light traveling in the first direction. On the contrary, since each of the second group of the pixel electrodes 316B is formed with the depressed portions 316b on both of the sides thereof in the second direction, the sealing layer is curved above the depressed portions 316b, to thereby diffusely reflect the light traveling in the second direction. With the above configuration, the light traveling in both of the first direction and the second direction is diffusely reflected, thereby being capable of preventing the color mixture of the pixels adjacent to each other.

Figure 9:
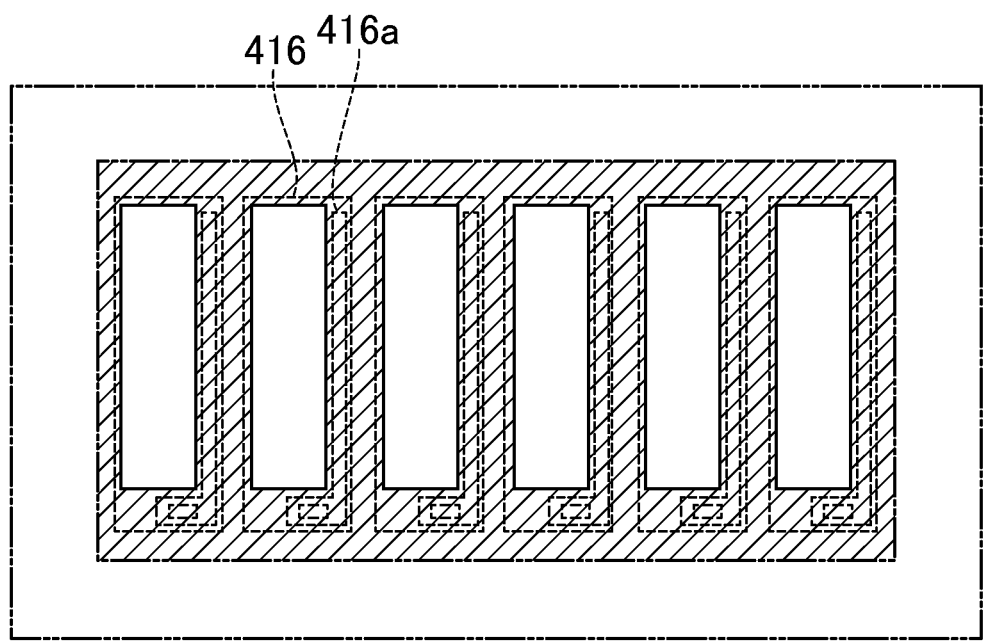
FIG. 9 is a partially enlarged plan view of an organic electroluminescent display device according to a modification 4 of the embodiment.

FIG. 9 is a partially enlarged plan view of an organic electroluminescent display device according to a modification 4 of the embodiment.

Even in this example, plural pixel electrodes 416 are arrayed in the second direction and the first direction. The pixel electrodes 416 each have a planar shape elongated in the first direction. A depressed portion 416a of each of the pixel electrodes 416 extends in the first direction at a position displaced in one of the second direction. According to the above configuration, when in color filters of a stripe layout, the colored layers of the same color extend in the first direction, and the colored layers of the different colors are arrayed in the second direction, the traveling of the light in the second direction where an influence of the color mixture becomes larger can be prevented.

Figure 10:
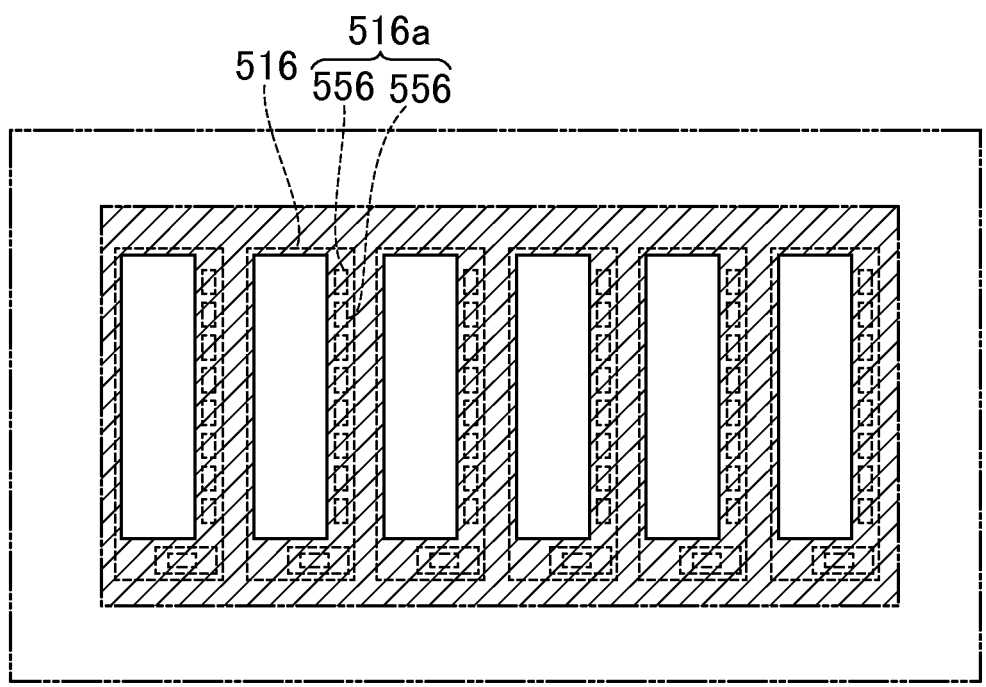
FIG. 10 is a partially enlarged plan view of an organic electroluminescent display device according to a modification 5 of the embodiment.

FIG. 10 is a partially enlarged plan view of an organic electroluminescent display device according to a modification 5 of the embodiment.

In this example, depressed portions 516a of pixel electrodes 516 are configured by plural divided depressed portions 556 that are arrayed at intervals between the adjacent divided depressed portions. The other details correspond to those described in the modification 4. According to the above configuration, since the depressed portions 516a are divided, the scattering of the light becomes larger, thereby increasing the color mixture prevention effect. Also, since the depressed portions 516a are divided, the degree of freedom of the layout increases, and a resist is easily formed when photolithography is applied to the forming process.

While there have been described what are at present considered to be certain embodiments of the invention, it will be understood that various modifications may be made thereto, and it is intended that the appended claims cover all such modifications as fall within the true spirit and scope of the invention. For example, at least one of the common layer, the common electrode, and the sealing layer may have its flat upper surface so as not to have a depressed portion or may have a raised portion on the upper surface.

What is claimed is:

1. An organic electroluminescent display device, comprising:
   a substrate;
   a plurality of pixel electrodes that are disposed on the substrate;
   an insulating layer that is disposed in areas between the respective pixel electrodes adjacent to each other so as to rest on at least peripheries of the respective pixel electrodes;
   an organic layer that is disposed with the inclusion of a common layer that continuously covers the plurality of pixel electrodes and the insulating layer;
   a common electrode that is disposed on the organic layer; and
   a sealing layer that is disposed to cover the organic layer and the common electrode,
   wherein each of the respective pixel electrodes has a depressed portion whose upper surface is recessed on an end of the periphery thereof, wherein the insulating layer has depressed portions whose upper surfaces are recessed by resting on the depressed portions of the respective pixel electrodes, and wherein the common layer has depressed portions whose upper surfaces are recessed in correspondence with the depressed portions of the insulating layer.

2. The organic electroluminescent display device according to claim 1, further comprising: a wiring layer that is disposed below the respective pixel electrodes, wherein at least a part of the depressed portions of the respective pixel electrodes is electrically connected to the wiring layer.

3. The organic electroluminescent display device according to claim 1, wherein the common electrode has depressed portions whose upper surfaces are recessed in correspondence with the depressed portions of the common layer.

4. The organic electroluminescent display device according to claim 3, wherein the sealing layer is curved in correspondence with the depressed portions of the common electrode.

5. An organic electroluminescent display device, comprising:

a substrate;

a plurality of pixel electrodes that are disposed on the substrate;

an insulating layer that is disposed in areas between the respective pixel electrodes adjacent to each other so as to rest on at least peripheries of the respective pixel electrodes;

an organic layer that is disposed with the inclusion of a common layer that continuously covers the plurality of pixel electrodes and the insulating layer;

a common electrode that is disposed on the organic layer; and a sealing layer that is disposed to cover the organic layer and the common electrode, wherein each of the respective pixel electrodes has a depressed portion whose upper surface is recessed on an end of the periphery thereof, wherein the plurality of pixel electrodes are arrayed in a second direction and a first direction, and wherein the depressed portions of the respective pixel electrodes are continuously formed over from an area extending in the first direction at a position displaced in one of the second direction to an area extending in the second direction at a position displaced in one of the first direction.

6. An organic electroluminescent display device, comprising:

a substrate;

a plurality of pixel electrodes that are disposed on the substrate;

an insulating layer that is disposed in areas between the respective pixel electrodes adjacent to each other so as to rest on at least peripheries of the respective pixel electrodes;

an organic layer that is disposed with the inclusion of a common layer that continuously covers the plurality of pixel electrodes and the insulating layer;

a common electrode that is disposed on the organic layer;

a sealing layer that is disposed to cover the organic layer and the common electrode; and a wiring layer that is disposed below the respective pixel electrodes, wherein each of the respective pixel electrodes has a depressed portion whose upper surface is recessed on an end of the periphery thereof, wherein at least a part of the depressed portions of the respective pixel electrodes is electrically connected to the wiring layer, wherein the plurality of pixel electrodes are arrayed in a second direction and a first direction, and wherein the depressed portions of the respective pixel electrodes are continuously formed over from a first area extending in the first direction at a position displaced in one of the second direction to a second area extending in the second direction at a position displaced in one of the first direction.

7. The organic electroluminescent display device according to claim 6, wherein the depressed portions of the respective pixel electrodes are continuously and electrically connected to the wiring layer over from the first area to the second area.

* * * * *